United States Patent
Huang

(10) Patent No.: US 11,456,752 B2
(45) Date of Patent: Sep. 27, 2022

(54) PIPELINE ANALOG TO DIGITAL CONVERTER AND ANALOG TO DIGITAL CONVERSION METHOD

(71) Applicant: REALTEK SEMICONDUCTOR CORPORATION, Hsinchu (TW)

(72) Inventor: Shih-Hsiung Huang, Hsinchu (TW)

(73) Assignee: REALTEK SEMICONDUCTOR CORPORATION, Hsinchu (TW)

(*) Notice: Subject to any disclaimer, the term of this patent is extended or adjusted under 35 U.S.C. 154(b) by 0 days.

(21) Appl. No.: 17/408,524

(22) Filed: Aug. 23, 2021

(65) Prior Publication Data
US 2022/0158648 A1 May 19, 2022

(30) Foreign Application Priority Data

Nov. 19, 2020 (TW) ................................ 109140483

(51) Int. Cl.
*H03M 1/38* (2006.01)
*H03M 1/12* (2006.01)
*H03M 1/46* (2006.01)

(52) U.S. Cl.
CPC ........... *H03M 1/122* (2013.01); *H03M 1/124* (2013.01); *H03M 1/462* (2013.01)

(58) Field of Classification Search
CPC .... H03M 1/001; H03M 1/1009; H03M 1/164; H03M 1/145; H03M 3/414; H03M 1/06; H03M 1/0626; H03M 1/0854; H03M 1/1004; H03M 1/1023; H03M 1/1042; H03M 1/109; H03M 1/1295; H03M 1/14; H03M 1/069; H03M 1/141; H03M 1/168; H03M 1/188; H03M 1/361; H03M 1/38;
(Continued)

(56) References Cited

U.S. PATENT DOCUMENTS

| 6,563,445 B1 | 5/2003 | Sabouri | |
| 8,779,963 B1* | 7/2014 | Bales | H03M 1/007 341/161 |
| 9,312,840 B2* | 4/2016 | Dong | H03M 1/0626 |

(Continued)

OTHER PUBLICATIONS

OA letter of the counterpart TW application(appl. No. 109140483) mailed on May 24, 2021. Summary of the OA letter: Claims 1-10 are rejected as allegedly being anticipated by the cited reference 1 (US 10536161 B1).

(Continued)

*Primary Examiner* — Linh V Nguyen
(74) *Attorney, Agent, or Firm* — WPAT, PC

(57) ABSTRACT

A pipeline analog to digital converter includes converter circuitries. The converter circuitries are configured to sequentially convert an input signal to be digital codes. The converter circuitries includes a first converter circuitry and a second converter circuitry. The first converter circuitry is configured to a convert a first signal to be a first digital code in the digital codes, and generate a first residue signal according to the first signal and the first digital code. The second converter circuitry is configured to receive the first signal and the first digital code to quantize the first signal according to the first digital code, in order to generate a second digital code in the digital codes, and generate a second residue signal according to the first residue signal and the second digital code.

20 Claims, 5 Drawing Sheets

(58) Field of Classification Search
CPC .......... H03M 3/38; H03M 3/412; H03M 3/46; H03M 3/464
USPC ................................ 341/155, 161, 162, 172
See application file for complete search history.

(56) References Cited

U.S. PATENT DOCUMENTS

| | | | |
|---|---|---|---|
| 9,595,974 B1* | 3/2017 | Pereira | H03M 1/164 |
| 9,768,793 B2* | 9/2017 | Meng | H03M 1/124 |
| 10,462,210 B2* | 10/2019 | Mayer | G06F 9/5072 |
| 10,536,161 B1 | 1/2020 | Zhang et al. | |
| 11,018,684 B1* | 5/2021 | Gupta | H03M 1/68 |
| 11,218,158 B1* | 1/2022 | Patil | H03M 1/1071 |
| 2019/0097648 A1* | 3/2019 | Sim | H03M 3/464 |
| 2019/0131992 A1* | 5/2019 | Ali | H03M 1/0687 |
| 2019/0305790 A1* | 10/2019 | Kinyua | H03M 1/164 |
| 2020/0136639 A1* | 4/2020 | Kinyua | H03F 3/45269 |
| 2020/0373934 A1* | 11/2020 | Shibata | H03M 1/1047 |
| 2021/0409035 A1* | 12/2021 | Lindholm | H03M 1/38 |

OTHER PUBLICATIONS

OA letter of the counterpart TW application (appl. No. 109140483) mailed on Nov. 3, 2021. Summary of the OA letter: 1. Claims 1-2, 4, and 9-10 are rejected as allegedly being anticipated by the cited reference 1 (U.S. Pat. No. 6,563,445 B1). 2. Claims 3 and 5-8 are allowable.

* cited by examiner

PIPELINE ANALOG TO DIGITAL CONVERTER AND ANALOG TO DIGITAL CONVERSION METHOD

BACKGROUND

1. Technical Field

The present disclosure relates to a pipeline analog to digital converter. More particularly, the present disclosure relates to a pipeline analog to digital converter that may extend an amplifying phase and an analog to digital conversion method.

2. Description of Related Art

A pipeline analog to digital converter may sequentially convert an input signal to be a corresponding digital code with multiple conversions. In an existing approach, an operating interval for each conversion is fixed. With the increasing clock speed, an interval of one period is getting shorter. In order to make the pipeline analog to digital converter properly process the conversion result in such short period, certain circuits (e.g., residue amplifier(s)) in the pipeline analog to digital converter are required to have higher current. As a result, overall power consumption and circuit area are increased.

SUMMARY

In some aspects, a pipeline analog to digital converter includes a plurality of converter circuitries. The plurality of converter circuitries are configured to sequentially convert an input signal to be a plurality of digital codes. The plurality of converter circuitries includes a first converter circuitry and a second converter circuitry. The first converter circuitry is configured to a convert a first signal to be a first digital code in the plurality of digital codes, and generate a first residue signal according to the first signal and the first digital code. The second converter circuitry is configured to receive the first signal and the first digital code to quantize the first signal according to the first digital code, in order to generate a second digital code in the plurality of digital codes, and generate a second residue signal according to the first residue signal and the second digital code.

In some aspects, an analog to digital conversion method includes the following operations: converting a first signal to be a first digital code, and generating a first residue signal according to the first signal and the first digital code; and quantizing the first signal according to the first digital code, in order to generate a second digital code, and generating a second residue signal according to the first residue signal and the second digital code.

These and other objectives of the present disclosure will be described in preferred embodiments with various figures and drawings.

DETAILED DESCRIPTION

The terms used in this specification generally have their ordinary meanings in the art and in the specific context where each term is used. The use of examples in this specification, including examples of any terms discussed herein, is illustrative only, and in no way limits the scope and meaning of the disclosure or of any exemplified term. Likewise, the present disclosure is not limited to various embodiments given in this specification.

In this document, the term "coupled" may also be termed as "electrically coupled," and the term "connected" may be termed as "electrically connected." "Coupled" and "connected" may mean "directly coupled" and "directly connected" respectively, or "indirectly coupled" and "indirectly connected" respectively. "Coupled" and "connected" may also be used to indicate that two or more elements cooperate or interact with each other. In this document, the term "circuit" may indicate an object, which is formed with one or more transistors and/or one or more active/passive elements based on a specific arrangement, for processing signals.

As used herein, the term "and/or" includes any and all combinations of one or more of the associated listed items. Although the terms "first," "second," etc., may be used herein to describe various elements, these elements should not be limited by these terms. These terms are used to distinguish one element from another. For example, a first element could be termed a second element, and, similarly, a second element could be termed a first element, without departing from the scope of the embodiments. For ease of understanding, like elements in various figures are designated with the same reference number.

Figure 1A:
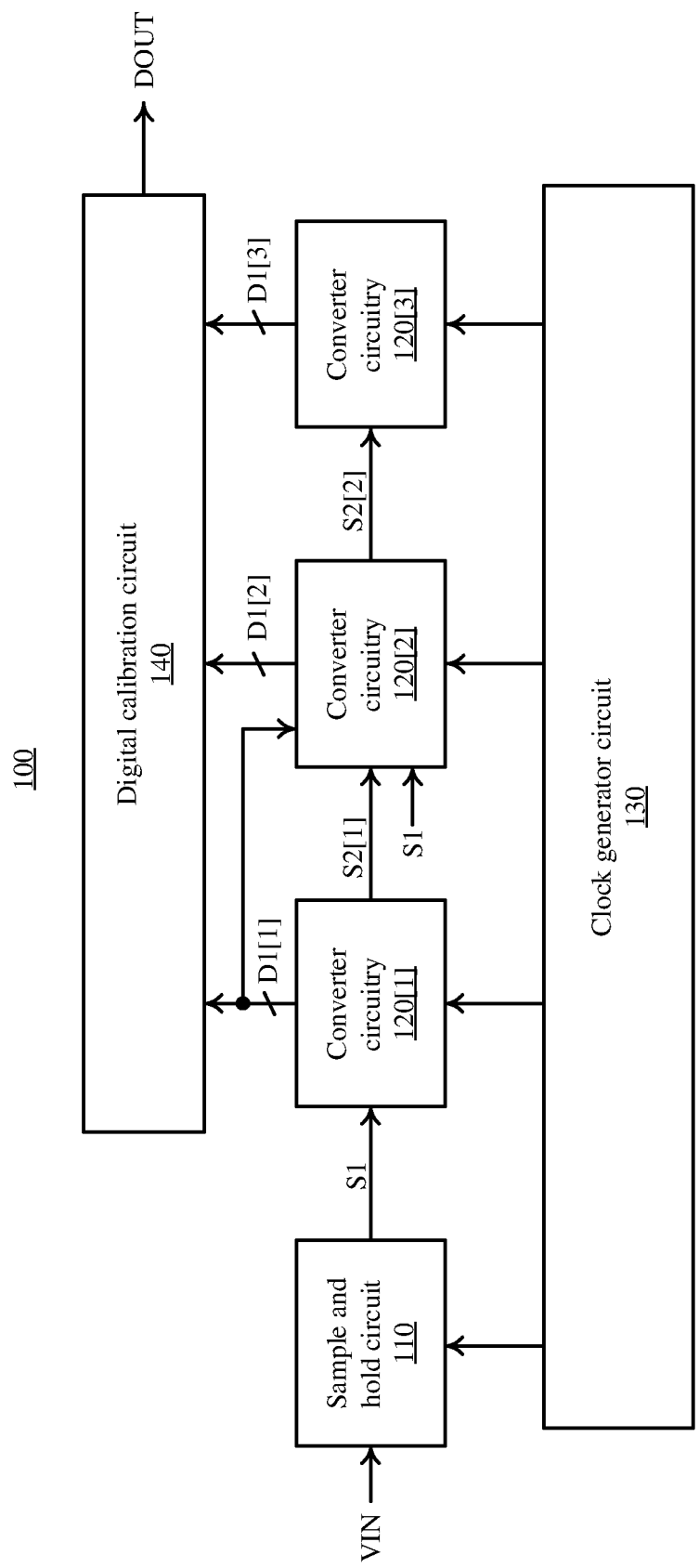
FIG. 1A is a schematic diagram of a pipeline analog to digital converter according to some embodiments of the present disclosure.
Figure 1B:
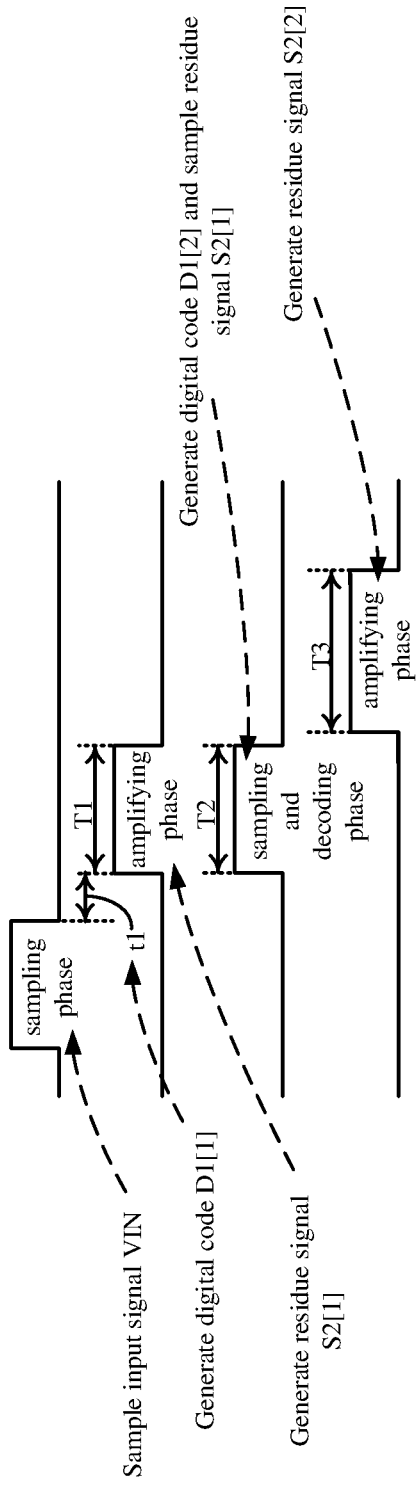
FIG. 1B is a timing diagram of operations of two converter circuitries in FIG. 1A according to some embodiments of the present disclosure.

FIG. 1A is a schematic diagram of a pipeline analog to digital converter 100 according to some embodiments of the present disclosure, and FIG. 1B is a timing diagram of operations of a converter circuitry 120[1] and a converter circuitry 120[2] in FIG. 1A according to some embodiments of the present disclosure.

The pipeline analog to digital converter 100 includes the sample and hold circuit 110, converter circuitries 120[1]-120[3], a clock generator circuit 130, and a digital calibration circuit 140. The sample and hold circuit 110 samples an input signal VIN, and outputs the sampled input signal VIN to be a signal S1. In some embodiments, the sample and hold circuit 110 may be implemented with a switched-capacitor circuit.

The converter circuitry 120[1]-120[3] sequentially convert the sampled input signal VIN (i.e., the signal S1) to be digital codes D1[1]-D1[3]. In greater detail, the converter circuitry 120[1] converts the signal S1 to generate the digital code D1[1], and generates a residue signal S2[1] according to the digital code D1[1] and the signal S1. The converter circuitry 120[2] receives the signal S1, the residue signal S2[1], and the digital code D1[1]. The converter circuitry 120[2] quantizes the signal S1 according to the digital code D1[1] to generate a digital code D1[2]. The converter circuitry 120[2] further generates a residue signal S2[2] according to the digital code D1[2] and the residue signal S2[1]. Related operations about the converter circuitry 120[1] and the converter circuitry 120[2] will be given with reference to FIG. 2 and FIG. 3. In some embodiments, the converter circuitry 120[3] may be (but not limited to) a flash analog to digital converter circuit, which is configured to generate the digital code D1[3] according to the residue signal S2[2].

The clock generator circuit 130 is configured to generate clock signals (not shown in the figure) to the sample and hold circuit 110 and the converter circuitries 120[1]-120[3]. As a result, the sample and hold circuit 110 and the converter circuitries 120[1]-120[3] may sequentially perform the above operations according to these clock signals. The digital calibration circuit 140 is configured to combine the digital codes D1[1]-D1[3] to generate a digital code DOUT. In some embodiments, the digital calibration circuit 140 may be configured to calibrate an offset error and/or a gain error in each converter circuitry 120[1]-120[3]. In some embodiments, the digital calibration circuit 140 may be implemented with digital logic circuit(s).

In some related approaches, a converter in a pipeline analog to digital converter is configured to convert a previous residue signal to generate a corresponding digital code, and the digital code is only utilized by that converter to generate a corresponding residue signal. In these approaches, before performing an analog to digital conversion, the converter is required to wait for the previous converter to generate the previous residue signal. As a result, an operating interval for the analog to digital conversion of each converter is limited. Compared with the above approaches, in some embodiments of the present disclosure, the converter circuitry 120[2] is configured to convert the sampled input signal VIN (i.e., converting the signal S1 instead of the residue signal S2[11], and the converter circuitry 120[2] is configured to directly receive the digital code D1[1]. With such arrangements, the converter circuitry 120[2] is able to enter an amplifying phase early, in order to start generating the residue signal S2[2].

For example, as shown in FIG. 1B, when the converter circuitry 120[1] generates the residue signal S2[1] during an amplifying phase T1, the converter circuitry 120[2] may perform the analog to digital conversion (i.e., generate the digital code D1 [2]) and samples the residue signal S2[1] during a sampling and decoding phase T2 simultaneously. The converter circuitry 120[1] performs the analog to digital conversion during a non-overlapped interval t1. Compared with the converter circuitry 120[1], the analog to digital conversion of the converter circuitry 120[2] is performed during the sampling and decoding phase T2 (instead of a non-overlapping interval between the sampling and decoding phase T2 and an amplifying phase T3). As a result, the limitation of the operating interval for the converter circuitry 120[2] to perform the analog to digital conversion (i.e. generate the digital code D1[2]) is lower, and may enter the amplifying phase T3 early to generate the residue signal S2[2]. With such arrangements, the amplifying phase T3 is longer than the amplifying phase T1. As a result, a current of the converter circuitry 120[2] can be lower, in order to lower the overall power consumption and circuit area.

Figure 2:
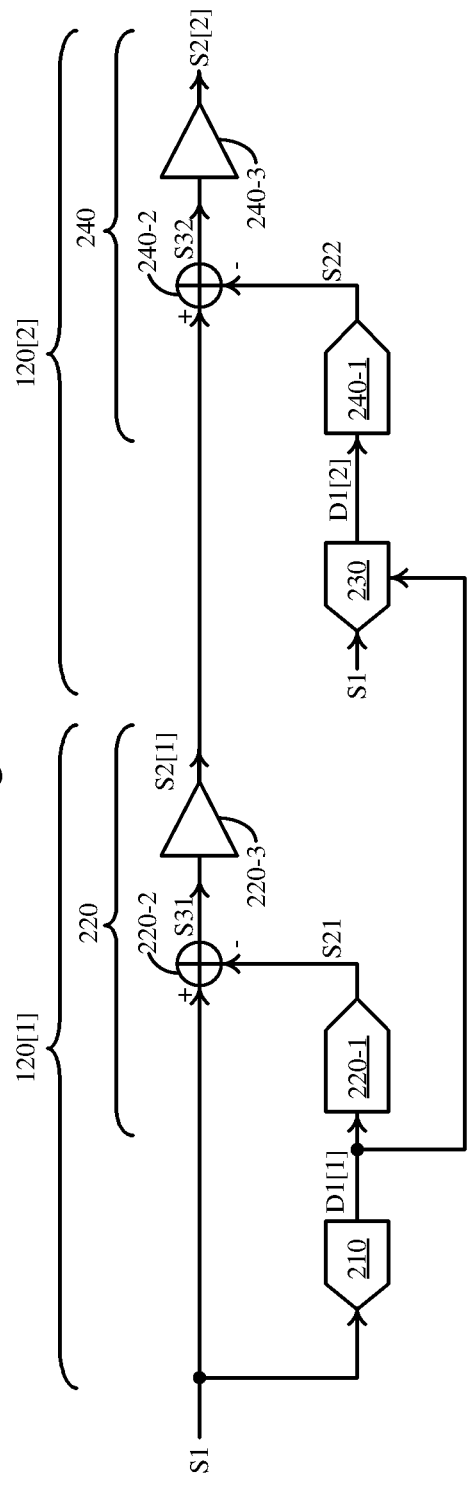
FIG. 2 is a circuit diagram of two converter circuitries in FIG. 1A according to some embodiments of the present disclosure.

FIG. 2 is a circuit diagram of the converter circuitry 120[1] and the converter circuitry 120[2] in FIG. 1A according to some embodiments of the present disclosure. The converter circuitry 120[1] includes a sub-analog to digital converter circuit 210 and a multiplying digital to analog converter circuit 220. The sub-analog to digital converter circuit 210 is configured to convert the signal S1 to generate the digital code D1[1]. In some embodiments, the sub-analog to digital converter circuit 210 may be (but not limited to) a flash analog to digital converter circuit. The multiplying digital to analog converter circuit 220 may be configured to process the digital code D1[1] and the signal S1, in order to generate the residue signal S2[1].

In greater detail, the multiplying digital to analog converter circuit 220 includes a sub-digital to analog converter circuit 220-1, a subtractor circuit 220-2, and a residue amplifier circuit 220-3. The sub-digital to analog converter circuit 220-1 may convert the digital code D1[1] to be a signal S21. The subtractor circuit 220-2 may be configured to subtract the signal S21 from the signal S1, in order to generate a signal S31. The residue amplifier circuit 220-3 may amplify the signal S31 to output the residue signal S2[1]. In some embodiments, the sub-digital to analog converter circuit 220-1, the subtractor circuit 220-2, and the residue amplifier circuit 220-3 may be implemented with a switched-capacitor circuit (not shown). Certain switches in the switched-capacitor circuit are turned on during the sampling phase, in order to sample the input signal VIN to be the signal S1. Other switches in the switched capacitor circuit are turned on during the amplifying phase T1, in order to generate the residue signal S2[1].

The converter circuitry 120[2] includes a sub-analog to digital converter circuit 230 and a multiplying digital to analog converter circuit 240. The sub-analog to digital converter circuit 230 receives the digital code D1[1] and the signal S1, and quantizes the signal S1 according to the digital code D1[1], in order to generate the digital code D1[2]. In some embodiments, the sub-analog to digital converter circuit 230 may be (but not limited to) a successive approximation register (SAR) analog to digital converter circuit. The multiplying digital to analog converter circuit 240 is configured to process the digital code D1[2] and the residue signal S2[1], in order to generate the residue signal S2[2].

The multiplying digital to analog converter circuit 240 includes a sub-digital to analog converter circuit 240-1, a subtractor circuit 240-2, and a residue amplifier circuit 240-3. The sub-digital to analog converter circuit 240-1 may convert the digital code D1[2] to be the signal S22. The subtractor circuit 240-2 subtracts the signal S22 from the residue signal S2[1], in order to generate a signal S32. The residue amplifier circuit 240-3 may amplify the signal S32 to output the residue signal S2[2]. In some embodiments, the sub-digital to analog converter circuit 240-1, the subtractor circuit 240-2, and the residue amplifier circuit 240-3 may be implemented with a switched-capacitor circuit (not shown in the figure). Certain switches in the switched-capacitor circuit are turned on during the sampling and decoding phase T2, in order to sample the residue signal S2[1]. Other switches in the switched-capacitor circuit are turned on during the amplifying phase T3, in order to generate the residue signal S2[2].

Figure 3:
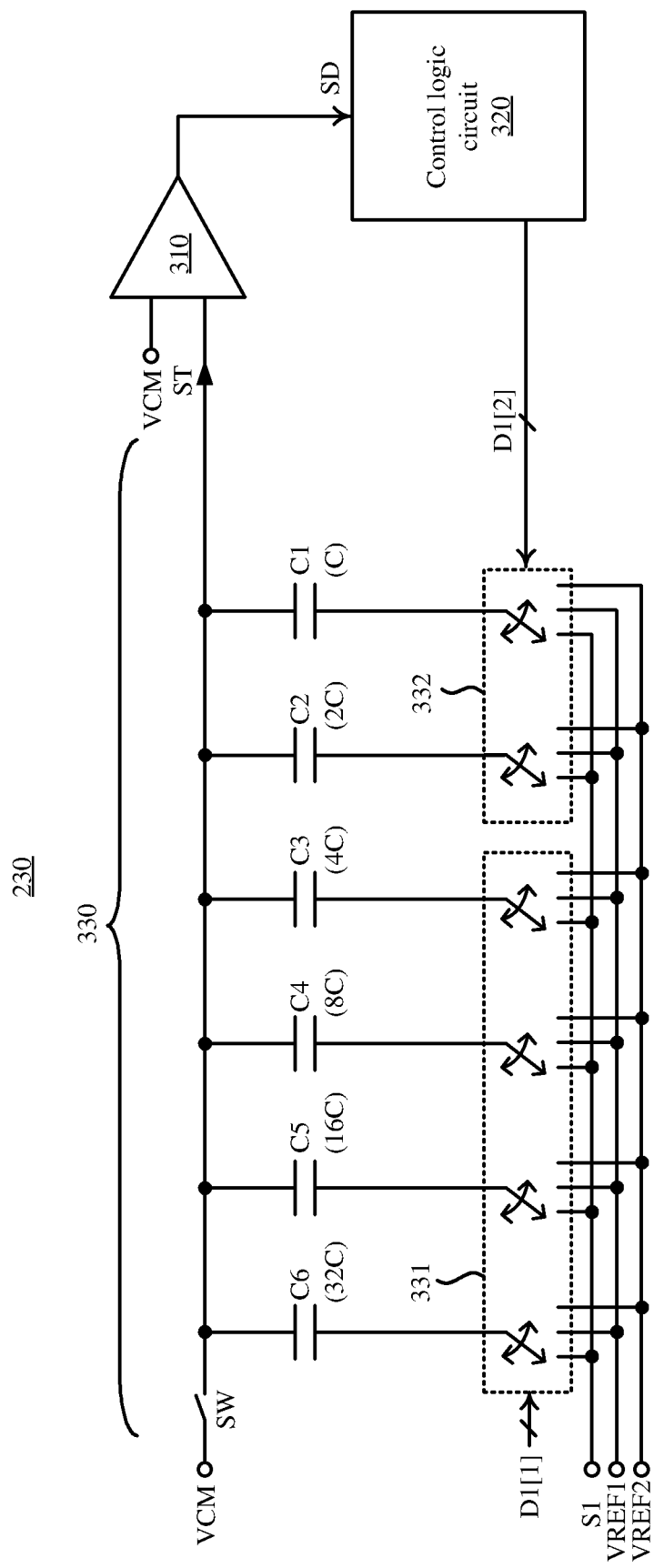
FIG. 3 is a schematic diagram of the sub-analog to digital converter circuit in FIG. 3 according to some embodiments of the present disclosure.

FIG. 3 is a schematic diagram of the sub-analog to digital converter circuit 230 in FIG. 3 according to some embodiments of the present disclosure. In this example, the sub-analog to digital converter circuit 230 is a SAR analog to digital converter circuit, which includes a comparator circuit 310, a control logic circuit 320, and a capacitor array circuit 330.

A terminal of the capacitor array circuit 330 receives a predetermined voltage VCM (or a common-mode voltage) via a switch SW during the sampling and decoding phase T2, and another one terminal of the capacitor array circuit 330 samples the signal S1, in order to generate a signal ST. The comparator circuit 310 is configured to compare the predetermined voltage VCM with the signal ST to generate a decision signal SD. The control logic circuit 320 performs a binary search algorithm according to the decision signal SD, in order to sequentially switch the capacitor array circuit 330 to generate bits in the digital code D1[2]. Before the control logic circuit 320 starts switching the capacitor array circuit 330 (i.e., before start outputting the digital code D1[2]), the capacitor array circuit 330 is further configured to switch a part of capacitors (e.g., capacitors C3-C6) according to the digital code D1[1], in order to adjust the signal ST.

In greater detail, the capacitor array circuit 330 includes a switching circuit 331, a switching circuit 332, and capacitors C1-C6. Capacitance values of the capacitors C1-C6 are sequentially C, 2C, 4C, 8C, 16C, and 32C. In other words, a weighted value of the capacitor C1 is 1, a weighted value of the capacitor C2 is 2, . . . , and a weighted value of the capacitor C6 is 32. In some embodiments, the capacitor C3-C6 having higher weighted values correspond to most significant bits (MSB), and the capacitors C1-C2 having lower weighted values correspond to least significant bits (LSB).

The switching circuit 331 includes switches that selectively transmit the signal S1, a reference voltage VREF1, or a reference voltage VREF2 (e.g., a ground voltage or a negative reference voltage) to the capacitor C3-C6 according to bits in the digital code D1[1]. The switching circuit 332 includes switches, which selectively transmit the signal S1, the reference voltage VREF1, or the reference voltage VREF2 to the capacitor C1-C2 according to the control of the control logic circuit 320 (i.e., according to bits in the digital code D1[2]). In other words, the capacitors C3-C6 are controlled by the digital code D1[1] (which is generated from a converter circuitry at the previous stage), and the capacitors C1-C2 are controlled by the digital code D1[2] (which is generated from a converter circuitry at the current stage), and the weighted value corresponding to each of the capacitors C3-C6 is higher than the weighted value corresponding to each of the capacitors C1-C2. As a result, before the control logic circuit 320 starts switching the capacitor array circuit 330, the level of the signal ST can be adjusted in advance according to the bits (which are 4 bits in this example) in the digital code D1[1].

The above arrangements are given with reference to examples where three converter circuitries 120[1]-120[3] are employed for illustrative purposes, but the present disclosure is not limited thereto. In other embodiments, the pipeline analog to digital converter 100 may include more converter circuitries, and arrangements of these converter circuitries may be similar to the arrangement of the converter circuitry 120[2]. FIG. 3 is given with reference to examples where the SAR analog to digital converter circuit is employed, but the present disclosure is not limited thereto. Various types of the sub-analog to digital converter circuit 230 that are able to adjust a signal level in advance according to the digital code D1[1] are within the contemplated scope of the present disclosure.

Figure 4:
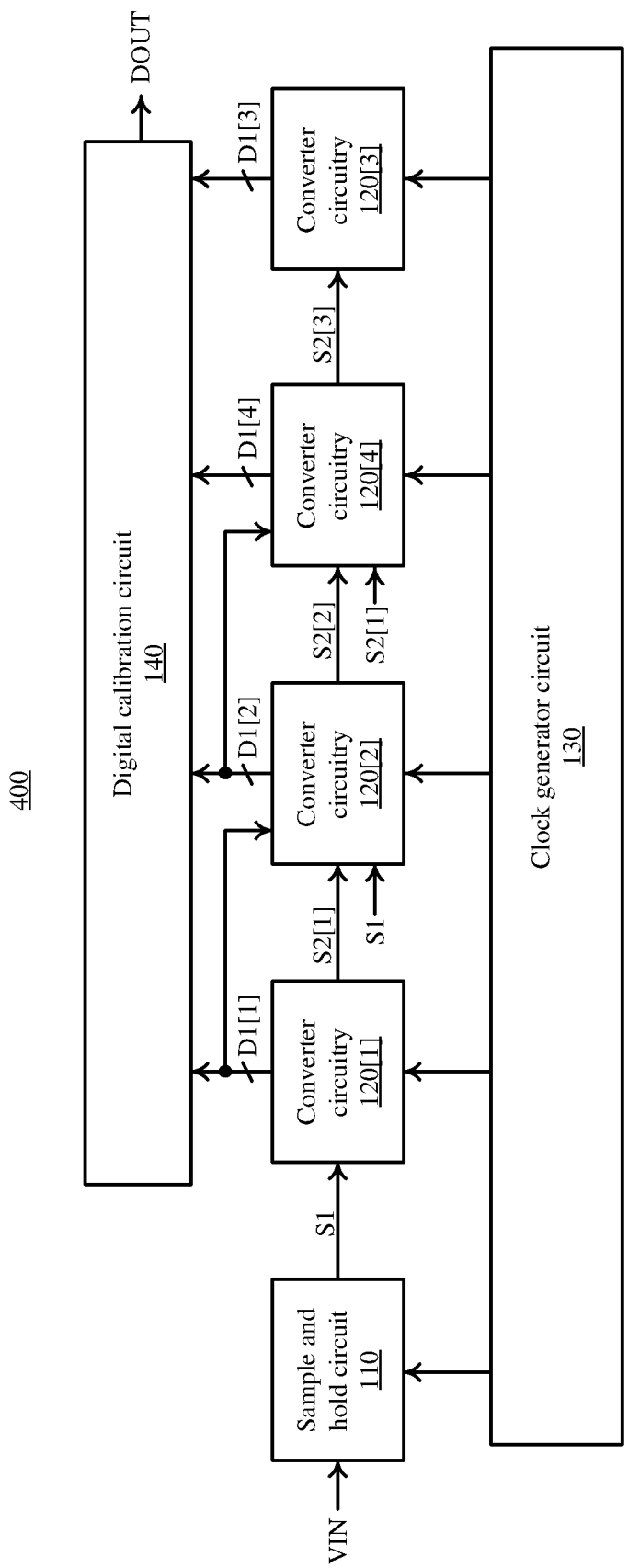
FIG. 4 is a schematic diagram of a pipeline analog to digital converter according to some embodiments of the present disclosure.

FIG. 4 is a schematic diagram of a pipeline analog to digital converter 400 according to some embodiments of the present disclosure. For example, the pipeline analog to digital converter 400 further includes a converter circuitry 120[4], which is coupled between the converter circuitry 120[2] and the converter circuitry 120[3]. The converter circuitry 120[4] generates a digital code D1[4] according to the residue signal S2[1], and generates a residue signal S2[3] according to the digital code D1[4] and the residue signal S2[2]. It is understood that, the arrangement of the converter circuitry 120[4] is similar to that of the converter circuitry 120[2]. For example, in the converter circuitry 120[4], the sub-analog to digital converter circuit (e.g., the sub-analog to digital converter circuit 230) quantizes the residue signal S2[1] transmitted from the converter circuitry 120[1], which is two stages in front of the converter circuitry 120[4], according to the digital code D1[2], in order to generate the digital code D1[4]. Similarly, in the converter circuitry 120[4], the multiplying digital to analog converter circuit (e.g., the multiplying digital to analog converter circuit 240) processes the digital code D1[2] and the residue signal S2[2], in order to generate a residue signal S2[3].

For ease of understanding, operations of the above embodiments are illustrated with reference to examples where a single-end circuit is employed, but the present disclosure is not limited thereto. It is understood that, the above embodiments may be implemented with a differential circuit as well. In other words, the pipeline analog to digital converter 100 (or the pipeline analog to digital converter 400) implemented with a single-end circuit or a differential circuit is with the contemplated scope of the present disclosure.

Figure 5:
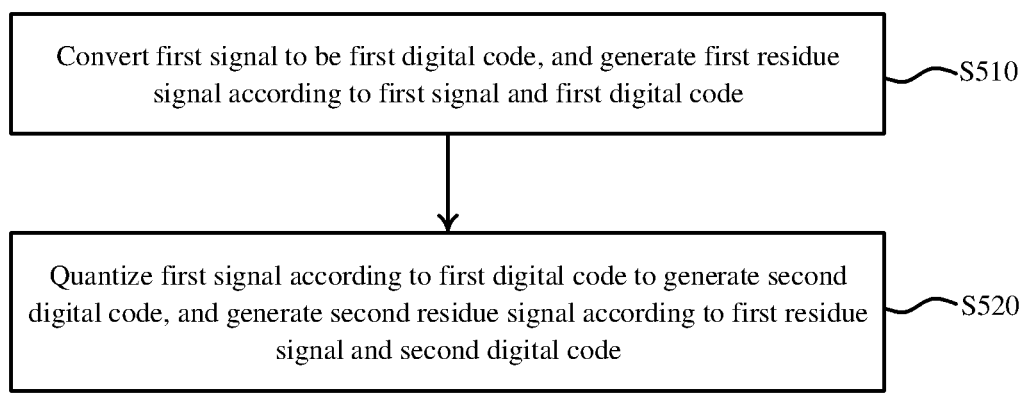
FIG. 5 is a flow chart of an analog to digital conversion method according to some embodiments of the present disclosure.

FIG. 5 is a flow chart of an analog to digital conversion method 500 according to some embodiments of the present disclosure. In some embodiments, the analog to digital conversion method 500 may be (but not limited to) performed by the pipeline analog to digital converter 100 in FIG. 1A or the pipeline analog to digital converter 400 in FIG. 4.

In operation S510, a first signal is converted to be a first digital code, and a first residue signal is generated according to the first signal and the first digital code. For example, the first signal may be the sampled input signal VIN (i.e., the signal S1) in FIG. 1A or the residue signal S2[1] in FIG. 4.

In operation S520, the first signal is quantized to generate a second digital code according to the first digital code, and a second residue signal is generated according to the first residue signal and the second digital code.

Operations S510 and S520 can be understood with reference to the above embodiments, and thus the repetitious descriptions are not further given. The above description of the analog to digital conversion method 500 includes exemplary operations, but the operations are not necessarily performed in the order described above. Operations of the analog to digital conversion method 500 may be added, replaced, changed order, and/or eliminated as appropriate, or the operations are able to be executed simultaneously or partially simultaneously as appropriate, in accordance with the spirit and scope of various embodiments of the present disclosure.

As described above, the pipeline analog to digital converter and the analog to digital conversion method in some embodiments of the present disclosure are able to lower limitations on the operating interval for performing the analog to digital conversion, and to extend the amplifying phase for generating the residue signal. As a result, the power consumption and the circuit area can be saved.

Various functional components or blocks have been described herein. As will be appreciated by persons skilled in the art, in some embodiments, the functional blocks will preferably be implemented through circuits (either dedicated circuits, or general purpose circuits, which operate under the control of one or more processors and coded instructions), which will typically comprise transistors or other circuit elements that are configured in such a way as to control the operation of the circuitry in accordance with the functions and operations described herein. As will be further appreciated, the specific structure or interconnections of the circuit elements will typically be determined by a compiler, such as a register transfer language (RTL) compiler. RTL compilers operate upon scripts that closely resemble assembly language code, to compile the script into a form that is used for the layout or fabrication of the ultimate circuitry. Indeed, RTL is well known for its role and use in the facilitation of the design process of electronic and digital systems.

The aforementioned descriptions represent merely some embodiments of the present disclosure, without any intention to limit the scope of the present disclosure thereto. Various equivalent changes, alterations, or modifications based on the claims of present disclosure are all consequently viewed as being embraced by the scope of the present disclosure.

What is claimed is:

1. A pipeline analog to digital converter, comprising:
a plurality of converter circuitries configured to sequentially convert an input signal to be a plurality of digital codes, wherein the plurality of converter circuitries comprises:
a first converter circuitry configured to a convert a first signal to be a first digital code in the plurality of digital codes, and generate a first residue signal according to the first signal and the first digital code; and
a second converter circuitry configured to receive the first signal and the first digital code to quantize the first signal according to the first digital code, in order to generate a second digital code in the plurality of digital codes, and generate a second residue signal according to the first residue signal and the second digital code.

2. The pipeline analog to digital converter of claim 1, wherein the first signal is a corresponding one of the input signal or a previous residue signal, and the previous signal is a residue signal generated from a converter circuitry that is two stages in front of the second converter circuitry in the plurality of converter circuitries.

3. The pipeline analog to digital converter of claim 1, wherein the second converter circuitry comprises a successive approximation register analog to digital converter circuit, and the successive approximation register analog to digital converter circuit is configured to quantize the first signal according to the first digital code, in order to generate the second digital code.

4. The pipeline analog to digital converter of claim 1, wherein the second converter circuitry comprises:
a sub-analog to digital converter circuit configured to quantize the first signal according to the first digital code, in order to generate the second digital code; and
a multiplying digital to analog converter circuit configured to generate the second residue signal according to the second digital code and the first residue signal.

5. The pipeline analog to digital converter of claim 4, wherein the sub-analog to digital converter circuit comprises:
a comparator circuit configured to compare a second signal with a predetermined voltage, in order to generate a decision signal;

a control logic circuit configured to generate the second digital code according to the decision signal; and
a capacitor array circuit configured to generate the second signal according to the first digital code and the second digital code.

6. The pipeline analog to digital converter of claim 5, wherein the capacitor array circuit comprises a plurality of first capacitors and a plurality of second capacitors, the plurality of first capacitors are controlled by the first digital code, the plurality of second capacitors are controlled by the second digital code, and a weighted value corresponds to each of the plurality of first capacitors is higher than a weighted value corresponds to each of the plurality of second capacitors.

7. The pipeline analog to digital converter of claim 5, wherein before the control logic circuit generates the second digital code, the capacitor array circuit is configured to adjust a level of the second signal according the first digital code.

8. The pipeline analog to digital converter of claim 1, wherein the first converter circuitry generates the first residue signal during a first amplifying phase, the second converter circuitry generates the second residue signal during a second amplifying phase, and the second amplifying phase is longer than the first amplifying phase.

9. The pipeline analog to digital converter of claim 1, wherein the second converter circuitry generates the second digital code and samples the first residue signal during the same phase.

10. The pipeline analog to digital converter of claim 1, wherein the first converter circuitry comprises a flash analog to digital converter circuit, and the flash analog to digital converter circuit is configured to convert the first signal to generate the first digital code.

11. The pipeline analog to digital converter of claim 1, wherein the second converter circuitry directly receives the first digital code.

12. An analog to digital conversion method, comprising:
converting a first signal to be a first digital code, and generating a first residue signal according to the first signal and the first digital code; and
quantizing the first signal according to the first digital code, in order to generate a second digital code, and generating a second residue signal according to the first residue signal and the second digital code.

13. The analog to digital conversion method of claim 12, wherein the second digital code is generated from a first converter circuitry in a plurality of converter circuitries, the first signal is a corresponding one of a previous residue signal or an input signal received by the plurality of converter circuitries, and the previous residue signal is generated from a converter circuitry that is two stages in front of the first converter circuitry in the plurality of converter circuitries.

14. The analog to digital conversion method of claim 12, wherein the second digital code is generated from a successive approximation register analog to digital converter circuit.

15. The analog to digital conversion method of claim 12, wherein quantizing the first signal according to the first digital code, in order to generate the second digital code, and generating the second residue signal according to the first residue signal and the second digital code comprises:
comparing a second signal with a predetermined voltage, in order to generate a decision signal;
generating the second digital code according to the decision signal; and generating, by a capacitor array circuit, the second signal according to the first digital code and the second digital code.

16. The analog to digital conversion method of claim 15, wherein the capacitor array circuit comprises a plurality of first capacitors and a plurality of second capacitors, the plurality of first capacitors are controlled by the first digital code, the plurality of second capacitors are controlled by the second digital code, and a weighted value corresponds to each of the plurality of first capacitors is higher than a weighted value corresponds to each of the plurality of second capacitors.

17. The analog to digital conversion method of claim 15, wherein before the second digital code is generated, the capacitor array circuit is configured to adjust a level of the second signal according to the first digital code.

18. The analog to digital conversion method of claim 12, wherein the first residue signal is generated during a first amplifying phase, the second residue signal is generated during a second amplifying phase, and the second amplifying phase is longer than the first amplifying phase.

19. The analog to digital conversion method of claim 12, wherein the second digital code and the second residue signal are generated from a converter circuitry, and the converter circuitry generates the second digital code and samples the first residue signal during the same phase.

20. The analog to digital conversion method of claim 12, wherein the first digital code is generated from a flash analog to digital converter circuit.

\* \* \* \* \*